(12) United States Patent
Jo et al.

(10) Patent No.: US 9,058,865 B1
(45) Date of Patent: Jun. 16, 2015

(54) MULTI-LEVEL CELL OPERATION IN SILVER/AMORPHOUS SILICON RRAM

(75) Inventors: Sung Hyun Jo, Sunnyvale, CA (US); Tanmay Kumar, Pleasanton, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 13/525,096

(22) Filed: Jun. 15, 2012

Related U.S. Application Data

(60) Provisional application No. 61/503,447, filed on Jun. 30, 2011.

(51) Int. Cl.
*G11C 13/00* (2006.01)

(52) U.S. Cl.
CPC ...................... *G11C 13/00* (2013.01)

(58) Field of Classification Search
CPC ........................................ G11C 13/00
USPC .......................................... 365/148
See application file for complete search history.

(56) References Cited

U.S. PATENT DOCUMENTS

| | | | |
|---|---|---|---|
| 5,499,208 A | 3/1996 | Shoji | |
| 5,627,451 A | 5/1997 | Takeda | |
| 5,673,223 A | 9/1997 | Park | |
| 5,923,587 A | 7/1999 | Choi | |
| 6,002,268 A | 12/1999 | Sasaki et al. | |
| 6,181,587 B1 | 1/2001 | Kuramoto et al. | |
| 6,731,535 B1 | 5/2004 | Ooishi et al. | |
| 6,849,891 B1 | 2/2005 | Hsu et al. | |
| 6,867,618 B2 | 3/2005 | Li et al. | |
| 6,897,519 B1 | 5/2005 | Dosluoglu | |
| 7,167,387 B2 | 1/2007 | Sugita et al. | |
| 7,251,152 B2 | 7/2007 | Roehr | |
| 7,274,587 B2 | 9/2007 | Yasuda | |
| 7,345,907 B2 | 3/2008 | Scheuerlein | |
| 7,515,454 B2 | 4/2009 | Symanczyk | |

(Continued)

FOREIGN PATENT DOCUMENTS

| | | |
|---|---|---|
| EP | 1096465 A2 | 2/2001 |
| JP | 2011-23645 A | 2/2011 |

(Continued)

OTHER PUBLICATIONS

Office Action for U.S. Appl. No. 12/815,318 dated May 16, 2012.

(Continued)

*Primary Examiner* — Hoai V Ho
*Assistant Examiner* — Min Huang
(74) *Attorney, Agent, or Firm* — Amin, Turocy & Watson, LLP

(57) ABSTRACT

A method of programming a non-volatile memory device includes providing a resistive switching device, the resistive switching device being in a first state and characterized by at least a first resistance, applying a first voltage to the resistive switching device in the first state to cause the resistive switching device to change to a second state wherein the second state is characterized by at least a second resistance, wherein the second resistance is greater than the first resistance, and applying a second voltage to the resistive switching device in the second state to cause the resistive switching device to change to a third state, wherein the third state is characterized by at least a third resistance, wherein the second voltage has a magnitude higher than a magnitude of the second voltage, and wherein the third resistance is greater than the second resistance.

20 Claims, 3 Drawing Sheets

(56) References Cited

U.S. PATENT DOCUMENTS

| | | | |
|---|---|---|---|
| 7,561,461 | B2 | 7/2009 | Nagai et al. |
| 7,606,059 | B2 | 10/2009 | Toda |
| 7,667,442 | B2 | 2/2010 | Itoh |
| 7,692,959 | B2 | 4/2010 | Krusin-Elbaum et al. |
| 7,704,788 | B2 | 4/2010 | Youn et al. |
| 7,746,696 | B1 | 6/2010 | Paak |
| 7,764,536 | B2 | 7/2010 | Luo et al. |
| 7,830,698 | B2 | 11/2010 | Chen et al. |
| 7,869,253 | B2 | 1/2011 | Liaw et al. |
| 8,054,679 | B2 | 11/2011 | Nakai et al. |
| 8,102,018 | B2 | 1/2012 | Bertin et al. |
| 8,243,542 | B2 | 8/2012 | Bae et al. |
| 8,315,079 | B2 | 11/2012 | Kuo et al. |
| 8,369,139 | B2 | 2/2013 | Liu et al. |
| 8,456,892 | B2 | 6/2013 | Yasuda |
| 8,467,226 | B2 | 6/2013 | Bedeschi et al. |
| 8,502,185 | B2 | 8/2013 | Lu et al. |
| 8,675,384 | B2 | 3/2014 | Kuo et al. |
| 2003/0036238 | A1 | 2/2003 | Toet et al. |
| 2004/0170040 | A1* | 9/2004 | Rinerson et al. ............ 365/26 |
| 2006/0231910 | A1 | 10/2006 | Hsieh et al. |
| 2006/0286762 | A1 | 12/2006 | Tseng et al. |
| 2007/0069119 | A1 | 3/2007 | Appleyard et al. |
| 2007/0133250 | A1 | 6/2007 | Kim |
| 2007/0171698 | A1 | 7/2007 | Hoenigschmid et al. |
| 2008/0019163 | A1 | 1/2008 | Hoenigschmid et al. |
| 2008/0043521 | A1 | 2/2008 | Liaw et al. |
| 2008/0165571 | A1 | 7/2008 | Lung |
| 2008/0192531 | A1 | 8/2008 | Tamura et al. |
| 2008/0278988 | A1 | 11/2008 | Ufert |
| 2008/0301497 | A1 | 12/2008 | Chung et al. |
| 2009/0014707 | A1 | 1/2009 | Lu et al. |
| 2009/0091981 | A1 | 4/2009 | Park et al. |
| 2009/0231910 | A1 | 9/2009 | Liu et al. |
| 2009/0251941 | A1 | 10/2009 | Saito |
| 2009/0321706 | A1 | 12/2009 | Happ et al. |
| 2010/0039136 | A1 | 2/2010 | Chua-Eoan et al. |
| 2010/0067279 | A1 | 3/2010 | Choi |
| 2010/0102290 | A1 | 4/2010 | Lu et al. |
| 2010/0110767 | A1 | 5/2010 | Katoh et al. |
| 2010/0157656 | A1 | 6/2010 | Tsuchida |
| 2010/0171086 | A1 | 7/2010 | Lung et al. |
| 2010/0182821 | A1 | 7/2010 | Muraoka et al. |
| 2010/0237314 | A1 | 9/2010 | Tsukamoto et al. |
| 2010/0243983 | A1 | 9/2010 | Chiang et al. |
| 2010/0277969 | A1 | 11/2010 | Li et al. |
| 2011/0033967 | A1 | 2/2011 | Lutz et al. |
| 2011/0063888 | A1 | 3/2011 | Chi et al. |
| 2011/0066878 | A1 | 3/2011 | Hosono et al. |
| 2011/0089391 | A1 | 4/2011 | Mihnea et al. |
| 2011/0122679 | A1 | 5/2011 | Chen et al. |
| 2011/0204314 | A1 | 8/2011 | Baek et al. |
| 2011/0205780 | A1 | 8/2011 | Yasuda et al. |
| 2011/0310656 | A1 | 12/2011 | Kreupl et al. |
| 2011/0317470 | A1 | 12/2011 | Lu et al. |
| 2012/0044751 | A1 | 2/2012 | Wang et al. |
| 2012/0074507 | A1 | 3/2012 | Jo et al. |
| 2012/0091420 | A1* | 4/2012 | Kusai et al. ............ 257/4 |
| 2012/0120712 | A1 | 5/2012 | Kawai et al. |
| 2012/0122290 | A1 | 5/2012 | Nagashima |
| 2012/0176831 | A1 | 7/2012 | Xiao et al. |
| 2012/0218807 | A1* | 8/2012 | Johnson ............ 365/148 |
| 2012/0243292 | A1* | 9/2012 | Takashima et al. ......... 365/148 |
| 2012/0320660 | A1 | 12/2012 | Nazarian et al. |
| 2013/0134379 | A1* | 5/2013 | Lu ............ 257/4 |
| 2013/0235648 | A1* | 9/2013 | Kim et al. ............ 365/148 |

FOREIGN PATENT DOCUMENTS

| | | |
|---|---|---|
| KR | 10-2009-0051206 A | 5/2009 |
| WO | WO 2011/005266 A1 | 1/2011 |

OTHER PUBLICATIONS

International Search Report for PCT/US2011/046036 filed on Jul. 29, 2011.
Written Opinion of the International Searching Authority for PCT/US2011/046036 filed on Jul. 29, 2011.
Office Action for U.S. Appl. No. 12/900,232 dated Jul. 30, 2012.
Notice of Allowance for U.S. Appl. No. 13/051,296 dated Aug. 31, 2012.
Notice of Allowance for U.S. Appl. No. 12/900,232 dated Sep. 18, 2012.
International Search Report and Written Opinion for PCT/US2011/040362 filed on Jun. 14, 2011.
Office Action for U.S. Appl. No. 12/815,369 dated Mar. 14, 2012.
Notice of Allowance for U.S. Appl. No. 12/815,369 dated May 22, 2012.
Office Action for U.S. Appl. No. 12/834,610 dated Apr. 16, 2012.
R C Newman, "Defects in silicon", Rep. Prog. Phys., 1982, pp. 1163-1210, vol. 45, The Institute of Physics, Great Britain.
Office Action for U.S. Appl. No. 13/149,757 dated Jun. 19, 2012.
Notice of Allowance for U.S. Appl. No. 12/815,318 dated Nov. 29, 2012.
International Search Report and Written Opinion for PCT/US2012/044077 filed on Jun. 25, 2012.
Office Action for U.S. Appl. No. 13/651,169 dated Mar. 7, 2013.
Office Action for U.S. Appl. No. 13/174,077 dated Apr. 1, 2013.
Office Action for U.S. Appl. No. 13/764,710 dated Aug. 9, 2013.
Notice of Allowance for U.S. Appl. No. 13/481,696 dated Sep. 30, 2013.
International Search Report and Written Opinion for PCT/US2013/042746 dated May 24, 2013.
Notice of Allowability for U.S. Appl. No. 13/651,169 dated Oct. 28, 2013.
Notice of Allowance for U.S. Appl. No. 13/194,500 dated Oct. 28, 2013.
Office Action for U.S. Appl. No. 13/194,479 dated Sep. 25, 2013.
Liu, Ming et al., "rFPGA: CMOS-Nano Hybrid FPGA Using RRAM Components", IEEE International Symposium on Nanoscale Architectures, Jun. 12-13, 2008, pp. 93-98, Anaheim, CA.
International Search Report and Written Opinion for PCT/US2012/040232 filed on May 31, 2012.
Office Action for U.S. Appl. No. 13/585,759 dated May 7, 2013.
Office Action for U.S. Appl. No. 13/592,224 dated May 23, 2013.
Notice of Allowance for U.S. Appl. No. 13/585,759 dated Sep. 19, 2013.
Office Action for U.S. Appl. No. 13/921,157 dated Oct. 3, 2013.
Office Action for U.S. Appl. No. 13/525,096, dated Dec. 27, 2013.
Office Action for U.S. Appl. No. 13/960,735, dated Dec. 6, 2013.
International Search Report and Written Opinion for PCT/US2013/054976, filed on Aug. 14, 2013.
Office Action for U.S. Appl. No. 13/531,449, dated Jun. 30, 2014.
Office Action for U.S. Appl. No. 14/166,691, dated Jul. 9, 2014.

* cited by examiner

MULTI-LEVEL CELL OPERATION IN SILVER/AMORPHOUS SILICON RRAM

CROSS REFERENCE TO RELATED APPLICATIONS

The subject application for patent claims priority to U.S. provisional patent application No. 61/503,447 filed on Jun. 30, 2011.

STATEMENT RELATED TO GOVERNMENT OR FEDERALLY FUNDED RESEARCH

Not Applicable

BACKGROUND

The inventors of the present invention have recognized the success of semiconductor devices has been mainly driven by an intensive transistor down-scaling process. However, as field effect transistors (FETs) approach sizes less than 100 nm, physical problems such as short channel effect begin to hinder proper device operation. For transistor based memories, such as those commonly known as Flash memories, other performance degradations or problems may occur as device sizes shrink. With Flash memories, a high voltage is usually required for programming of such memories. However, as device sizes shrink, the high programming voltage can result in dielectric breakdown and other problems. Similar problems can occur with other types of non-volatile memory devices other than Flash memories.

The inventors of the present invention recognize that many other types of non-volatile random access memory (RAM) devices have been explored as next generation memory devices, such as: ferroelectric RAM (Fe RAM); magneto-resistive RAM (MRAM); organic RAM (ORAM); phase change RAM (PCRAM); and others.

A common drawback with these memory devices include that they often require new materials that are incompatible with typical CMOS manufacturing. As an example of this, Organic RAM or ORAM requires organic chemicals that are currently incompatible with large volume silicon-based fabrication techniques and foundries. As another example of this, Fe-RAM and MRAM devices typically require materials using a high temperature anneal step, and thus such devices cannot be normally be incorporated with large volume silicon-based fabrication techniques.

Additional drawbacks with these devices include that such memory cells often lack one or more key attributes required of non-volatile memories. As an example of this, Fe-RAM and MRAM devices typically have fast switching (e.g. "0" to "1") characteristics and good programming endurance. However, such memory cells are difficult to scale to small sizes. In another example of this, for ORAM devices reliability of such memories is often poor. As yet another example of this, switching of PCRAM devices typically include Joules heating and undesirably require high power consumption.

From the above, a new semiconductor device structure and integration is desirable.

BRIEF SUMMARY OF THE PRESENT INVENTION

The present invention is generally related to resistive switching devices. More particularly, embodiments according to the present invention provide a programming method for a multi-level cell. Embodiments of the present invention have been applied to non-volatile memory devices using silver as a conductor material and an amorphous silicon material as a switching material, but it should be recognized that the present invention can have a much broader range of applicability.

In a specific embodiment, a method for programming a resistive switching device is provided. The method includes providing an as fabricated resistive switching device. The as fabricated resistive switching device is in a first state characterized by at least a first resistance. A first voltage is applied to the as fabricated resistive switching device to cause the as fabricated resistive switching device to change from the first state to a second state. The second state is characterized by at least a second resistance substantially the same as the first resistance. In a specific embodiment, the method includes applying a second voltage to the resistant switching device at the second state to cause the resistive switching device to change from the second state to a third state. The third state is characterized by at least a third resistance no greater than the second resistance. In a specific embodiment, a third voltage is applied to the resistant switching device at the third state to cause the resistive switching device to change from the third state to a fourth state. The fourth state is characterized by at least a fourth resistance. The third voltage is in an opposite polarity to the second voltage. The fourth resistance is greater than the third resistance and no greater than the second resistance in a specific embodiment.

In a specific embodiment, a resistive switching device is provided. The resistive switching device includes a first electrode, a second electrode, and a resistive switching material. The first electrode includes a first conductor material and configured to extend in a first direction in a specific embodiment. The second electrode includes at least a metal material and configured to extend in a second direction orthogonal to the first direction in a specific embodiment. In a specific embodiment, the resistive switching material is sandwiched between an intersection region of the first electrode and the second electrode in a specific embodiment. In a specific embodiment, the resistive switching material is characterized by one or more resistance states depending on an amplitude and a polarity of voltage applied to at least the second electrode. The resistive switching material includes at least an amorphous silicon material in a specific embodiment.

Many benefits can be facilitated by ways of the present invention over conventional techniques. The present method applies a forward bias voltage to a resistive switching device to cause the resistive switching device to be in a low resistance state or programmed state. To realize a multi-level cell, the present method applies at least one reverse biased voltage to the programmed cell to facilitate more than one resistance states or erased states and a multi-bit device. As conventional method uses different forward bias voltages to form a multi-bit device, capacitive discharge from a word line and a bit line interferes with programming of a cell. Such interference is eliminated by ways of the present invention. The resistance of the various erased states can be measured during application of the respective reversed bias voltage and a well controlled multi-level cell can be realized. Depending on the embodiment, one or more of these benefits can be facilitated. One skilled in the art would recognize other variations, modifications, and alternatives.

According to one aspect of the invention, a method of programming a non-volatile memory device is described. One method includes providing a resistive switching device, the resistive switching device being in a first state and characterized by at least a first resistance and applying a first voltage to the resistive switching device in the first state to cause the resistive switching device to change to a second state wherein the second state is characterized by at least a second resistance, wherein the second resistance is greater than the first resistance. A process may include applying a second voltage to the resistive switching device in the second state to cause the resistive switching device to change to a third state, wherein the third state is characterized by at least a third resistance, wherein the second voltage has a magnitude higher than a magnitude of the first voltage, and wherein the third resistance is greater than the second resistance.

According to another aspect of the invention, a resistive switching device is described. One device may include a first electrode, the first electrode comprising a first conductor material and configured to extend in a first direction, and a second electrode, the second electrode comprising at least a metal material and configured to extend in a second direction orthogonal to the first direction. A device may include a resistive switching material sandwiched between the first electrode and the second electrode, the resistive switching material comprising at least an amorphous silicon material, the resistive switching material being characterized by one or more resistance states depending on an amplitude and a polarity of voltage applied to at least the second electrode.

SUMMARY OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE PRESENT INVENTION

The present invention is generally related to resistive switching devices. More particularly, embodiments according to the present invention provide a programming method for a multi-level cell. Embodiments of the present invention have been applied to non-volatile memory devices using silver as a conductor material and an amorphous silicon material as a switching material, but it should be recognized that the present invention can have a much broader range of applicability.

A resistive switching device based on silver/amorphous silicon has the potential to have a multi bit operation. But current control during programming to obtain different states in the cell is difficult to facilitate especially for a far-far bit. This is due to capacitive discharge from a distributed capacitance and resistance from both a bitline and a wordline. Embodiments according to the present invention use a programmed (or written) cell and one or more erase operations to provide a well-controlled method for multi-level cell programming free from interference and uncertainty.

Figure 1:
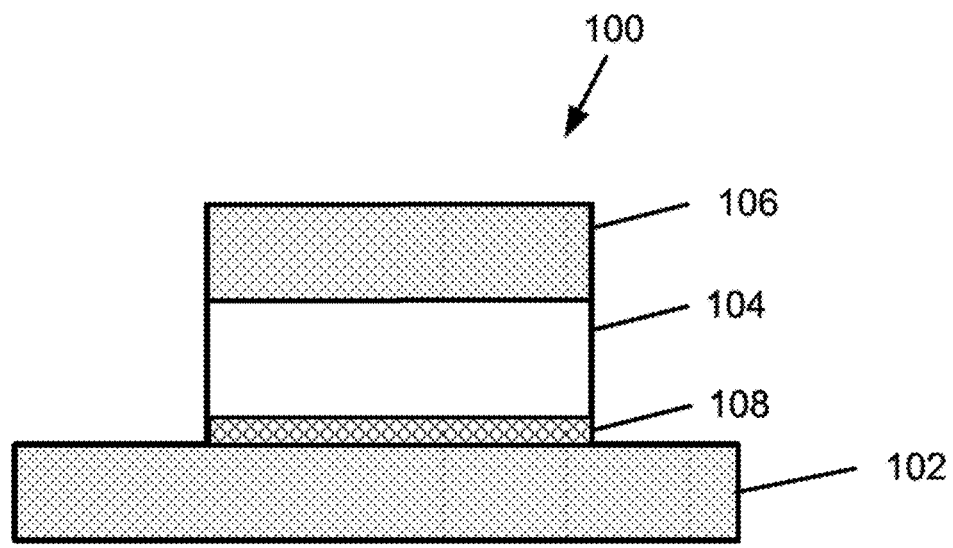
FIG. 1 is a simplified diagram illustrating a resistive switching device.

FIG. 1 is a simplified diagram illustrating a resistive switching device 100 according to an embodiment of the present invention. The resistive switching device includes a first electrode (e.g. bottom electrode) 102, a second electrode (e.g. a top electrode) 106, and a resistive switching material 104 sandwiched between the first electrode and the second electrode. As merely an example, the first electrode can be a first conductor material. The first electrode 102 can include a first conductive material such as a first metal material or a doped semiconductor material (p-type polysilicon, p-type SiGe). In a specific embodiment, the first metal material can be tungsten, aluminum, copper or other suitable metal that is compatible with CMOS fabrication techniques. In a specific embodiment, the first electrode is elongated in shape and extends in a first direction.

The resistive switching material 104 can include a suitable insulator material having a resistance that can be altered upon application of an electric field to the insulator material. In a specific embodiment, the resistive switching material can include a silicon material. For example, the silicon material can be an amorphous silicon material, a microcrystalline silicon material, a macro crystalline silicon material, a silicon germanium material including any combination of these materials, amorphous SixGeyOz (x+y+z=1; 0=<x, y, z=<1), intrinsic semiconductor, or the like. In an embodiment, the silicon material includes an amorphous silicon material having intrinsic characteristics.

The second electrode 106 can comprise a second conductive material and can have a portion that includes a second metal material. The second metal material can be aluminum, nickel, silver, gold, palladium, platinum, or another similar metal or combination of metals. The second metal material typically is characterized by a suitable diffusivity into the resistive switching material in a specific embodiment. In a specific embodiment, the second electrode 106 is elongated in shape and extends in a second direction that is orthogonal to the first direction. In a specific embodiment, the second metal material includes a silver material.

In certain embodiments, the resistive switching device further includes a contact material 108 disposed between the metal material of the first electrode 102 and the amorphous silicon material 104. The contact material is believed to provide a suitable interfacial defect characteristic for desirable switching behavior for the resistive switching device. For amorphous silicon material as the resistive switching material, the contact material can be p+polysilicon material, p+silicon germanium material, or the like. In certain embodiments, the contact material can be optional. The resistive switching device can be disposed in an N by M crossbar array with pillars of resistive switching material 104 located at the crossings of the array, to form a high density interconnected array of non-volatile memory cells.

Figure 2:
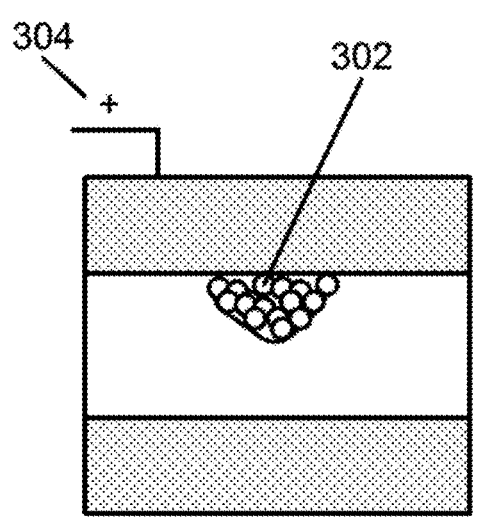
FIGS. 2-5 are simplified diagrams illustrating a resistive switching device under various operating conditions according to an embodiment of the present invention.

FIGS. 2-5 are simplified diagrams illustrating operations of a resistive switching device. As shown in FIG. 2, the second metal material forms a metal region 302 in a portion of the resistive switching material 104 when a first positive voltage 304 greater than a threshold voltage is applied to the second electrode 106. The threshold voltage is the forming voltage for the resistive switching device. In this configuration, the resistive switching device is at a high resistance state, otherwise known as an erase state, or an "OFF" state.

Figure 3:
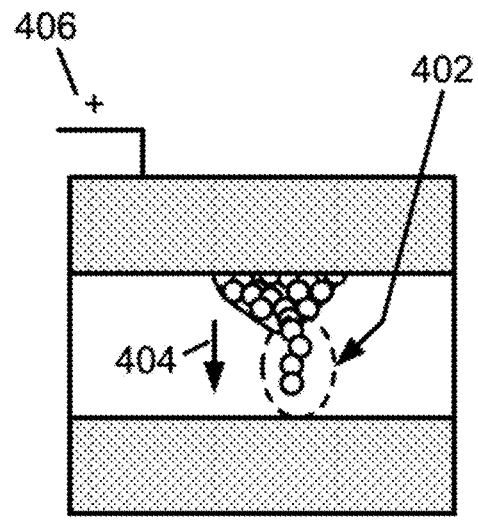

As shown in FIG. 3, the metal region may further form a filament region 402. The filament region 402 may be characterized by a length, a first distance between metal particles, a second distance between the filament and the first electrode 102, and the like. In FIG. 3, the filament extends in a direction 404 towards the first electrode 102 when a second positive bias voltage 406 is applied to the second electrode 106. In this configuration the resistive switching device 100 is in a low resistance state, otherwise known as a programmed or "ON" state, allowing current to flow through the resistive switching device 100.

Figure 4:
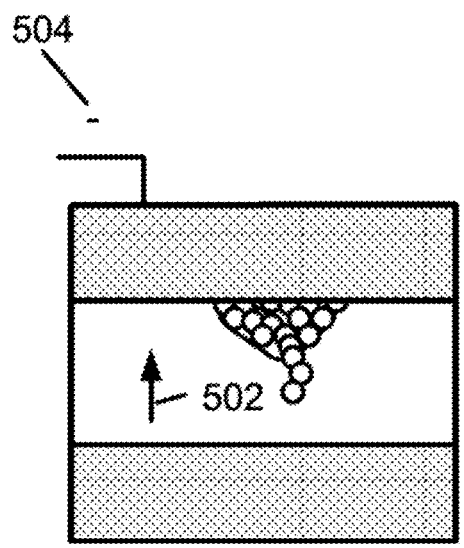

As illustrated in FIG. 4, the filament structure 402 retracts partially in a direction 502 away from first electrode 102, when a first negative bias voltage 504 or a first erase voltage is applied to the second electrode 106. As illustrated in FIG. 4, the filament structure 402 of FIG. 3 partially retracts in a direction 502 away from first electrode 102.

Figure 5:
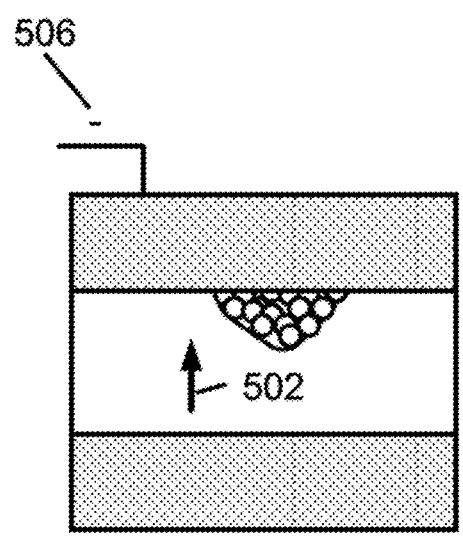

As illustrated in FIG. 5, the filament structure 402 of FIG. 3 retracts in a direction 502 away from first electrode 102, when a second negative bias voltage 506 or a second erase voltage is applied to the second electrode 106. In this configuration, the resistive switching device 100 is reverted back to the high resistance state illustrated in FIG. 2. Accordingly, as shown in FIGS. 2-5 the resistive switching device 100 is considered a two-terminal or a bipolar device.

In a specific embodiment, the top electrode 106 is configured to be elongated in shape and spatially extends in a first direction. The bottom electrode 102 is also elongated in shape and spatially extends in a second direction orthogonal to the first direction in a specific embodiment. The resistive switching material 104 is sandwiched in an intersection region between the top electrode 106 and the bottom electrode 102 in a specific embodiment. In a specific embodiment, the resistive switching device 100 is disposed in a high density and interconnected N by M crossbar array.

In operation, as a resistance of the resistive switching material 104 is dependent on the electric field in the switching material, conventionally, different resistance states are facilitated by applying a different second voltage to the device to provide for a multi-level or multi-bit cell. To determine the resistance state of a cell upon application of a predetermined voltage, an on-state current corresponding to each of the second voltage is measured. The on state current may not be consistent with a given applied voltage for all the cells in the array due to interference from RC delay and capacitance discharge from the top electrode 106 (e.g. bitline) and the bottom electrode 102 (e.g. wordline). Depending on the location of the cell in an array, a RC delay can differ for different cells and the on-state current is difficult to control.

Embodiments of the present invention provide a method to realize a multi-level cell free from uncertainty and interference from, for example, RC delay in an array. In a specific embodiment, a resistive switching device is provided at a first state. The first state may be in an as-fabricated state and is may be characterized by a first resistance. The resistive switching device is then subjected to a first voltage causing the resistive switching device to be in a second state (e.g. FIG. 2). In various embodiments, the second state is a high resistance state and an off-state current flows in the device, typically upon application of a read voltage. The first voltage is a forming voltage of the device in a specific embodiment.

In various embodiments, the method includes subjecting the resistive switching device to a second voltage to cause the resistive switching device to be in a third state (e.g. FIG. 3). In various embodiments filament 402 (FIG. 3) provides a low resistance path for current to flow from top electrode 106 to bottom electrode 102. The third state is thus considered in a low resistance state, or a programmed state and a pre-determined "on" state current flows in the device, typically upon application of a read voltage.

To facilitate a multi-level cell, in various embodiments, a third voltage is applied to the programmed cell having an opposite polarity to the second voltage. The third voltage causes the device to be in a fourth state. In various embodiments, the fourth state is characterized by a fourth resistance that is higher than the third (low) resistance. In some cases, the fourth state is a first erase state (e.g. FIG. 4), i.e. reduces the length of filament 402.

In various embodiments, the method can further apply a fourth voltage opposite in polarity to the second voltage (a programming voltage) and having an amplitude different from the fourth voltage, corresponding to a second erase voltage to cause the device to be in a fifth state (e.g. FIG. 4). The fifth state is characterized by a fifth resistance and the resistive switching device is now in a second erase state.

Accordingly, embodiments of the present method apply a forward biased voltage to the resistive switching device to cause the resistive switching device to be in a programmed state. In a specific embodiment, the method applies at least one reversed bias voltage to cause the programmed device to be in one or more erased states to facilitate a multi-level device or a multi-bit device in a specific embodiment. The different erased states can be realized by applying a voltage pulse having a pulse width and the resistance of the device can be measured from a current flow during the pulse width. Once a desirable resistance is obtained, the voltage is shut off and a precise resistance state can be facilitated.

In additional embodiments, the different resistance states can be obtained by applying a respective predetermined reverse bias voltage to the programmed device. In some embodiments, an erase voltage having an even higher amplitude would cause the device to be in a lower resistance state. The device would have a substantially fully erased state or a deep erased state (e.g. FIG. 5) when an erase voltage has about the same amplitude and opposite polarity as the programming voltage. Erase voltages having amplitudes lower than, for example, the programming voltage, would cause the device to be in various erase states (e.g. FIG. 4).

Figure 6:
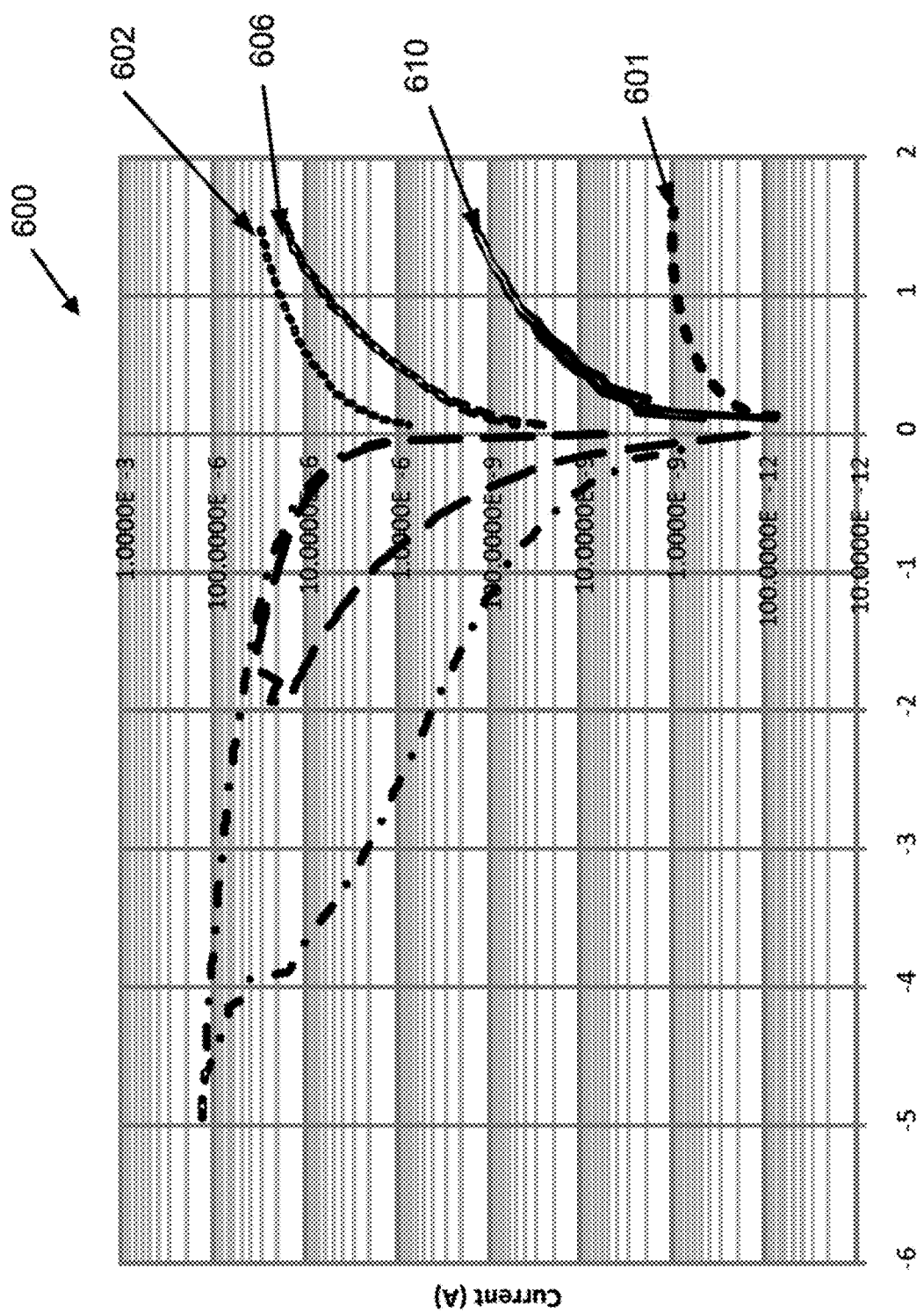
FIG. 6 is a simplified current versus voltage (IV) plots illustrating experimental results according to an embodiment of the present invention.

To illustrate embodiments of the present invention, experiments were performed. FIG. 6 are experimental results 500 illustrating a simplified current versus voltage characteristic of various erase states of a switching device according to an embodiment of the present invention. This diagram 500 is merely an example and should not unduly limit the claims herein. One skilled in the art would recognize other modifications, variations, and alternatives. The experiment was performed on a resistive switching device using an amorphous silicon material as a switching material and silver as the top electrode. A forming voltage is applied to an as fabricated device to cause the resistive switching device to be in a high resistance state and an off state current flows in the device (e.g. Plot 601). The forming process includes applying a forward bias positive voltage to the silver electrode in a specific embodiment.

Next, the resistive switching device is then subjected to a programming process to cause the switching material to be in a low resistance state or a programmed state as illustrated in Plot 602. More specifically, a programming voltage is applied and an on-state current flows in the device.

In FIG. 6, Plot 606 illustrates a first IV characteristic of the device after a first erase voltage is applied. The first erase voltage causes the device to be in a first shallow erase state. As can be seen, upon an applied voltage, the resultant current is lower than the IV characteristics of the programmed state in Plot 602. In various embodiments, the first erase voltage is of opposite polarity from the programming voltage, and is of smaller magnitude.

Next, when a second erase voltage greater in magnitude than the first erase voltage is applied, a second shallow erase state results and has a second IV characteristic as shown in Plot 610. As shown, the second erase state has a lower conductance than the first erase state, thus the IV characteristics are lower. In various embodiments, the second erase voltage is also of opposite polarity from the programming voltage, and is of smaller magnitude.

Finally, as shown, Plot 601 illustrates an IV characteristic of a deep erase state of the device after an erase voltage (in some embodiments of the same amplitude as the programming voltage, but of opposite polarity) is applied. In various embodiments, the device is in a high resistance state. As can be seen, because the resistance is higher the current flowing through the device is lower than the above plots.

As can be seen in the example in FIG. 6, the resistance state of the device can be varied by erasing the device after programming to different extents and therefore the device can be in different states in accordance with the erase voltage applied. Of course one skilled in the art would recognize other variations, modifications, and alternatives.

Though the present invention has been described using various examples and embodiments, it is also understood that the examples and embodiments described herein are for illustrative purposes only and that various modifications or alternatives in light thereof will be suggested to persons skilled in the art and are to be included within the spirit and purview of this application and scope of the appended claims.

What is claimed is:

1. A method of programming a non-volatile memory device, comprising:
    providing a resistive switching device comprising a resistive switching material and a first electrode, the resistive switching device being in a first state and characterized by at least a first resistance, wherein the first resistance is associated with a first length of a filament within a layer of resistive switching material, wherein the filament comprises metal material from the first electrode;
    applying a first voltage to the resistive switching device in the first state to cause the resistive switching device to change to a second state wherein the second state is characterized by at least a second resistance, wherein the second resistance is greater than the first resistance, wherein the second resistance is associated with a second length of the filament within the layer of resistive switching material; and
    applying a second voltage to the resistive switching device in the second state to cause the resistive switching device to change to a third state, wherein the third state is characterized by at least a third resistance, wherein the second voltage has a magnitude higher than a magnitude of the first voltage, wherein the third resistance is associated with a third length of the filament within a layer of resistive switching material, and wherein the third resistance is greater than the second resistance.

2. The method of claim 1 further comprising:
    providing an as fabricated resistive switching device, wherein the as fabricated switching device is characterized by a fourth resistance; and
    applying a forming voltage to the as fabricated resistive switching device to cause the resistive switching device to change to an off state associated with a fifth resistance, wherein the fourth resistance is substantially similar to the fifth resistance.

3. The method of claim 2 further comprising:
    applying a write voltage to the resistive switching device in the off state to cause the resistive switching device to change to the first state.

4. The method of claim 2 further comprising:
    applying an erase voltage to the resistive switching device in the third state to cause the resistive switching device to change to the off state.

5. The method of claim 4 wherein the erase voltage and the forming voltage are of opposite polarity.

6. The method of claim 1 wherein the first voltage and the second voltage are of similar polarity.

7. The method of claim 1 further comprising:
    applying a read voltage to the resistive switching device;
    determining a current in response to the read voltage; and
    determining a state of the resistive switching device in response to the current.

8. The method of claim 7 wherein the state is selected from a group consisting of: the second state, the third state.

9. The method of claim 7 wherein the state is the first state.

10. A resistive switching device comprises
    a first electrode, the first electrode comprising a first conductor material and configured to extend in a first direction;
    a second electrode, the second electrode comprising at least a metal material and configured to extend in a second direction orthogonal to the first direction; and
    a resistive switching material sandwiched between the first electrode and the second electrode, the resistive switching material comprising at least an amorphous silicon material, the resistive switching material being characterized by three or more resistance states depending on a length of a filament formed in the resistive switching material, wherein the filament comprises particles of the metal material from the second electrode, wherein the length of the filament is determined in response to an amplitude and a polarity of voltage applied to at least the second electrode, wherein a first resistance state is characterized by a first resistance and associated with a first length of a filament formed in the resistive switching material, wherein a second resistance state is characterized by a second resistance and associated with a second length of a filament formed in the resistive switching material, wherein the resistive switching device changes from the first resistance state to the second resistance state in response to application of a first voltage to the resistive switching device, wherein the second resistance is greater than the first resistance, wherein a third resistance state is characterized by a third resistance and associated with a third length of a filament formed in the resistive switching material, wherein the resistive switching device changes from the second resistance state to the third resistance state in response to application of a second voltage to the resistive switching device, wherein the second voltage has a magnitude higher than a magnitude of the first voltage, and wherein the third resistance is greater than the second resistance.

11. The device of claim 10 wherein the metal material is selected from a group consisting of: platinum, gold, silver, aluminum, nickel or palladium.

12. The device of claim 10 wherein the metal material comprises silver.

13. The device of claim 11 wherein the metal material forms a metal region in a portion of the resistive switching material in a vicinity of the second electrode in response to a forming voltage being applied to the second electrode.

14. The device of claim 13 wherein the metal material forms a filament region in a portion of the resistive switching material in a vicinity of the first electrode in response to a positive bias voltage greater than the forming voltage is applied to the second electrode and causes the resistive switching device to be in a on state, wherein the on state is associated with a first resistance.

15. The device of claim 14 wherein the filament region comprises a filament structure characterized by a length and a distance between metal particles.

16. The device of claim 15 wherein a length of the filament structure decreases from the first length to the second length and a resistance of the resistive switching material increases from the first resistance to the second resistance upon application of a first negative bias voltage.

17. The device of claim 16 wherein a length of the filament structure decreases from the second length to the third length and a resistance of the resistance switching material increases from the second resistance to the third resistance upon application of a second negative bias voltage, wherein the second negative bias voltage has an amplitude greater than the first negative bias voltage.

18. The device of claim 14 wherein the filament region is substantially reduced and a resistance of the resistance switching material increases from the third resistance to a fourth resistance upon application of a deep negative bias voltage.

19. The device of claim 10 wherein a resistance state of the resistive switching material is determined by current flow in response to a read voltage.

20. The device of claim 10 wherein the first conductor material comprises copper, tungsten, aluminum, copper or a doped silicon material.

* * * * *